(12) United States Patent
Tsai et al.

(10) Patent No.: US 7,221,147 B2
(45) Date of Patent: May 22, 2007

(54) METHOD AND SOCKET ASSEMBLY FOR TESTING BALL GRID ARRAY PACKAGE IN REAL SYSTEM

(75) Inventors: Cheng Hsun Tsai, Taipei (TW); Chen Lien Chiang, Taipei (TW)

(73) Assignee: RamTek Technology Inc., Taipei (TW)

( * ) Notice: Subject to any disclaimer, the term of this patent is extended or adjusted under 35 U.S.C. 154(b) by 0 days.

(21) Appl. No.: 11/336,918

(22) Filed: Jan. 23, 2006

(65) Prior Publication Data

US 2006/0261837 A1    Nov. 23, 2006

(30) Foreign Application Priority Data

May 20, 2005    (TW) ................ 94116574 A

(51) Int. Cl.
*G01R 31/26*    (2006.01)
(52) U.S. Cl. .................... 324/158.1; 324/755; 324/765
(58) Field of Classification Search ........ 324/754–761, 324/765; 439/62–70, 92–9, 93
See application file for complete search history.

(56) References Cited

U.S. PATENT DOCUMENTS 4,918,384 A * 4/1990 Giringer et al. ............ 324/761
5,702,255 A   12/1997 Murphy et al. ............... 439/71
6,150,829 A * 11/2000 Cuevas ....................... 324/760
6,246,246 B1 * 6/2001 Hembree ..................... 324/754
6,292,003 B1 * 9/2001 Fredrickson et al. ........ 324/754

FOREIGN PATENT DOCUMENTS

WO    WO 96/08056    * 3/1996

* cited by examiner

*Primary Examiner*—Vinh P. Nguyen
(74) *Attorney, Agent, or Firm*—Bacon & Thomas PLLC

(57) ABSTRACT

A method for testing a ball grid array package includes the following steps. Firstly, a printed circuit board having a plurality of contact pads thereon is provided. Then, a ball grid array test socket assembly having a connecting interface, a plurality of resilient contact members and a plurality of conducting members penetrating through the connecting interface is provided. The first terminal of each conducting member is in contact with the second terminal of corresponding resilient contact member. The second terminal of each conducting member is in contact with corresponding contact pad on the printed circuit board. Afterwards, the ball contacts of the ball grid array package are in contact with corresponding first terminals of the resilient contact members so as to test the ball grid array package.

18 Claims, 9 Drawing Sheets

METHOD AND SOCKET ASSEMBLY FOR TESTING BALL GRID ARRAY PACKAGE IN REAL SYSTEM

FIELD OF THE INVENTION

The present invention relates to a method and a socket assembly for testing a ball grid array package, and more particularly to a method and a socket assembly for testing a ball grid array package by using a printed circuit board of a real system.

BACKGROUND OF THE INVENTION

Ball grid array (BGA) packages are widely used in the art because they have high I/O densities and can be directly arranged on the printed circuit board according to a surface mount technology (SMT). As known, the BGA package should be tested according to a testing procedure. Since the BGA package has a higher I/O density and unique ball contacts, the method for testing the BGA package is more complicated than that for testing the conventional semiconductor package. Generally, the ball contacts of the BGA package are conductively connected to the contact pads of the printed circuit board via a BGA test socket assembly. In this instance, the ball contacts of the BGA package need not to be soldered onto the contact pads of the printed circuit board.

Referring to FIG. 1(a), a cross-sectional view of a conventional BGA test socket assembly is illustrated. The BGA test socket assembly is employed for interconnecting the ball contacts of the BGA package and the conducting holes of the printed circuit board. The BGA test socket assembly 1 of FIG. 1(a) comprises a socket body 10 and a clip member 11. The socket body 10 comprises an interface layer 101 and a receptacle 102. There are perforations 103 extending through the interface layer 101 between upper and lower surfaces thereof so as to accommodate corresponding number of resilient contact members 104. A ball grid array package 12 is accommodated in the receptacle 102 and clamped by the clip member 11 such that the ball contacts 120 are in contact with the upper terminal ends 104a of corresponding resilient contact members 104. The lower terminal ends 104b (i.e. pins) of the resilient contact members 104 project downwardly from the socket body 10 to touch corresponding conductive holes 130 of the printed circuit board 13. By means of the BGA test socket assembly 1, the performance properties of the ball grid array package 12 would be tested accordingly.

Please refer to FIG. 1(b). The BGA test socket assembly 1 of FIG. 1(a) is mounted on the printed circuit board 13 by inserting the lower terminal ends 104b of the resilient contact members 104 into the conductive holes 130. Since the lower terminal ends 104b of the resilient contact members 104 should be precisely inserted into the corresponding conductive holes 130 to perform the test procedure, the printed circuit board 13 should be tailored and not cost-effective. That is to say, the printed circuit board 13 is only applied to the unreal system. In addition, due to the high density of the resilient contact members 104, the lower terminal ends 104b are readily broken during the period of inserting them into the conductive holes 130 and thus erroneous test results may often occur. Moreover, with increasing improvement, the semiconductor packages are developed toward minimization and high integration, and thus the pin density of the semiconductor packages are growing higher and higher. In other words, the pitch between two adjacent pins becomes shorter and shorter as well as the pitch between the terminal pads on the test printed circuit board. The possibility of generating erroneous test results is increased.

Another BGA test socket assembly was disclosed in U.S. Pat. No. 5,702,255, entitled "BALL GRID ARRY SOCKET ASSEMBLY", which was filed on Dec. 30, 1997, and the contents of which are hereby incorporated by reference. The BGA test socket assembly 2 of FIG. 2 comprises a socket body 20 and a clip member 21. The socket body 20 comprises an interface layer 201 and a receptacle 202. There are perforations 203 extending through the interface layer 201 between upper and lower surfaces thereof so as to accommodate corresponding number of resilient contact members 204. A ball grid array package 22 is accommodated in the receptacle 202 and clamped by the clip member 21 such that the ball contacts 220 are in contact with the upper terminal ends 204a of corresponding resilient contact members 204. The lower terminal ends 204b (i.e. ball pins) of the respective resilient contact members 204 project downwardly from the socket body 20 to touch corresponding contact pads 230 on the printed circuit board 23 of an unreal system. By means of the BGA test socket assembly 2, the performance properties of the ball grid array package 22 would be tested accordingly.

As known, the process for forming the ball pins 204b on the lower terminal ends of the resilient contact members 204 is complicated. In addition, the process for assembling the resilient contact members 204 in the BGA test socket assembly 2 is time-consuming. Accordingly, a problem of poor connection may occur. If several BGA test socket assemblies 2 are intended to mount on the printed circuit board 23, each BGA test socket assembly 2 should be precisely aligned with the corresponding contact portions of the printed circuit board 23, and thus the testing procedure is not effective for testing plural BGA test socket assemblies 2 when a single printed circuit board 23 is used.

With increasing development of semiconductor industries, the size and shape of semiconductor package will be varied according to the manufacturer's design and/or the market's requirement. For complying with the semiconductor package to be tested, the size and the shape of the retaining base used in the test socket assembly should be varied accordingly. In the conventional test socket assembly, however, the retaining base is not replaceable and has unchanged size and shape. Under this circumstance, in order to test the semiconductor packages conforming to different specifications, different moulds should be fabricated to produce proper test socket assemblies. Therefore, the testing process is not cost effective and is time-consuming.

Accordingly, the above-described prior art method is not a perfect design and has still many disadvantages to be solved. In views of the above-described disadvantages resulted from the prior art, the applicant keeps on carving unflaggingly to develop a method and socket assembly for testing a ball grid array package according to the present invention through wholehearted experience and research.

SUMMARY OF THE INVENTION

An object of the present invention is to provide a method and a socket assembly for testing a ball grid array package by using a printed circuit board of a real system.

Another object of the present invention is to provide a ball grid array package test socket assembly capable of simultaneously testing plural ball grid array packages.

In accordance with an aspect of the present invention, there is provided a method for testing a ball grid array package. Firstly, a printed circuit board having a plurality of contact pads thereon is provided. Then, a ball grid array test socket assembly having a connecting interface, a plurality of resilient contact members and a plurality of conducting members penetrating through the connecting interface is provided. The first terminal of each conducting member is in contact with the second terminal of corresponding resilient contact member. The second terminal of each conducting member is in contact with corresponding contact pad on the printed circuit board. Afterwards, the ball contacts of the ball grid array package are in contact with corresponding first terminals of the resilient contact members so as to test the ball grid array package.

In an embodiment, the second terminal of each conducting member is a ball pin.

In an embodiment, the second terminal of each conducting member is contact with corresponding contact pad on the printed circuit board by a surface mount technology.

Preferably, the conducting member is made of a metallic material selected from a group consisting of tin and copper.

In an embodiment, the ball grid array test socket assembly further comprises a fixing member to fix the plurality of resilient contact member therein.

In an embodiment, the fixing member comprises first and second fixing parts having a plurality of openings, and the resilient contact members penetrate through the openings.

In an embodiment, the ball grid array test socket assembly further comprises a supporting member having a receptacle for accommodating the connecting interface and the first fixing member therein.

In an embodiment, the ball grid array test socket assembly further comprises a retaining base disposed on the first fixing member and having another receptacle for accommodating the ball grid array package therein, and the ball contacts of the ball grid array package are in contact with corresponding resilient contact members.

In an embodiment, the ball grid array test socket assembly further comprises a cover plate with a foldable lid pivotally coupled thereto.

In accordance with another aspect of the present invention, there is provided a socket assembly for testing a ball grid array package. The ball contacts of the ball grid array package are conductively connected to corresponding contact pads on a printed circuit board via the socket assembly. The socket assembly comprises a connecting interface, a plurality of resilient contact members and a plurality of conducting members penetrating through the connecting interface. The first terminal of each resilient contact member is in contact with corresponding ball contact of the ball grid array package. The first terminal of each conducting member is in contact with the second terminal of corresponding resilient contact member. The second terminal of each conducting member is in contact with corresponding contact pad on the printed circuit board.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
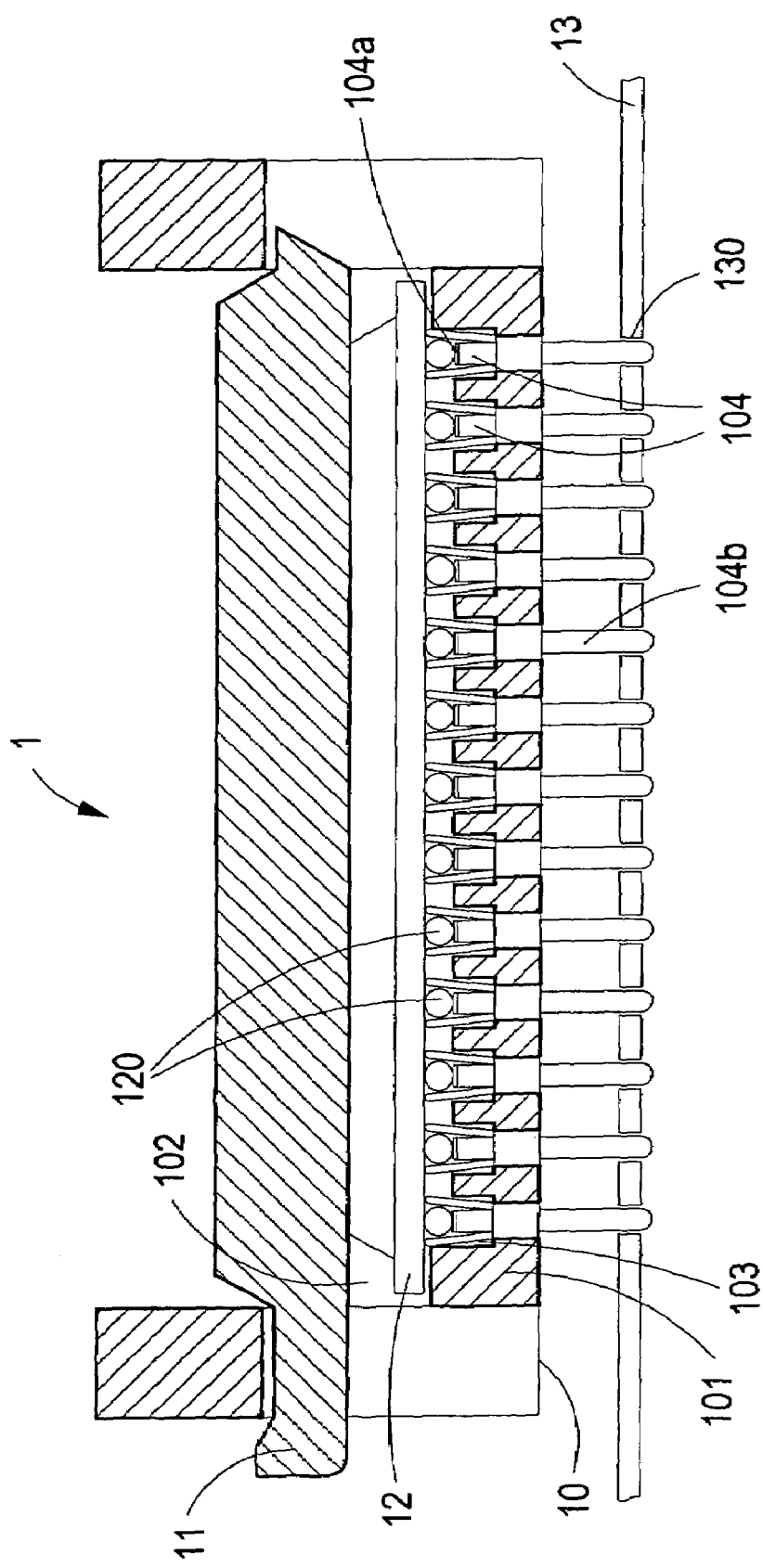
FIG. 1(a) is a cross-sectional view of a conventional BGA test socket assembly.
Figure 1B:
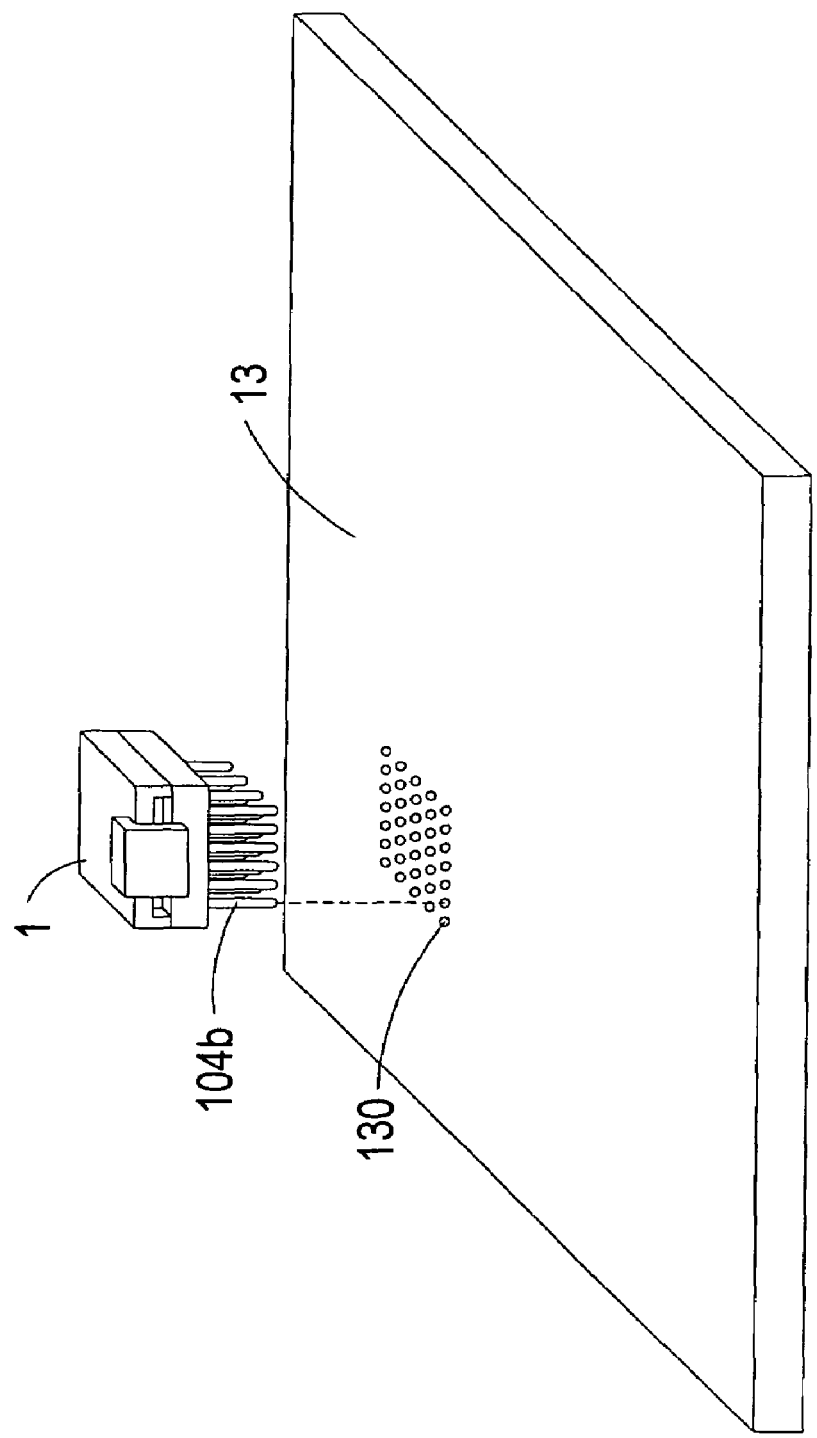
FIG. 1(b) schematically illustrates the BGA test socket assembly of FIG. 1(a) to be mounted on a printed circuit board.
Figure 2:
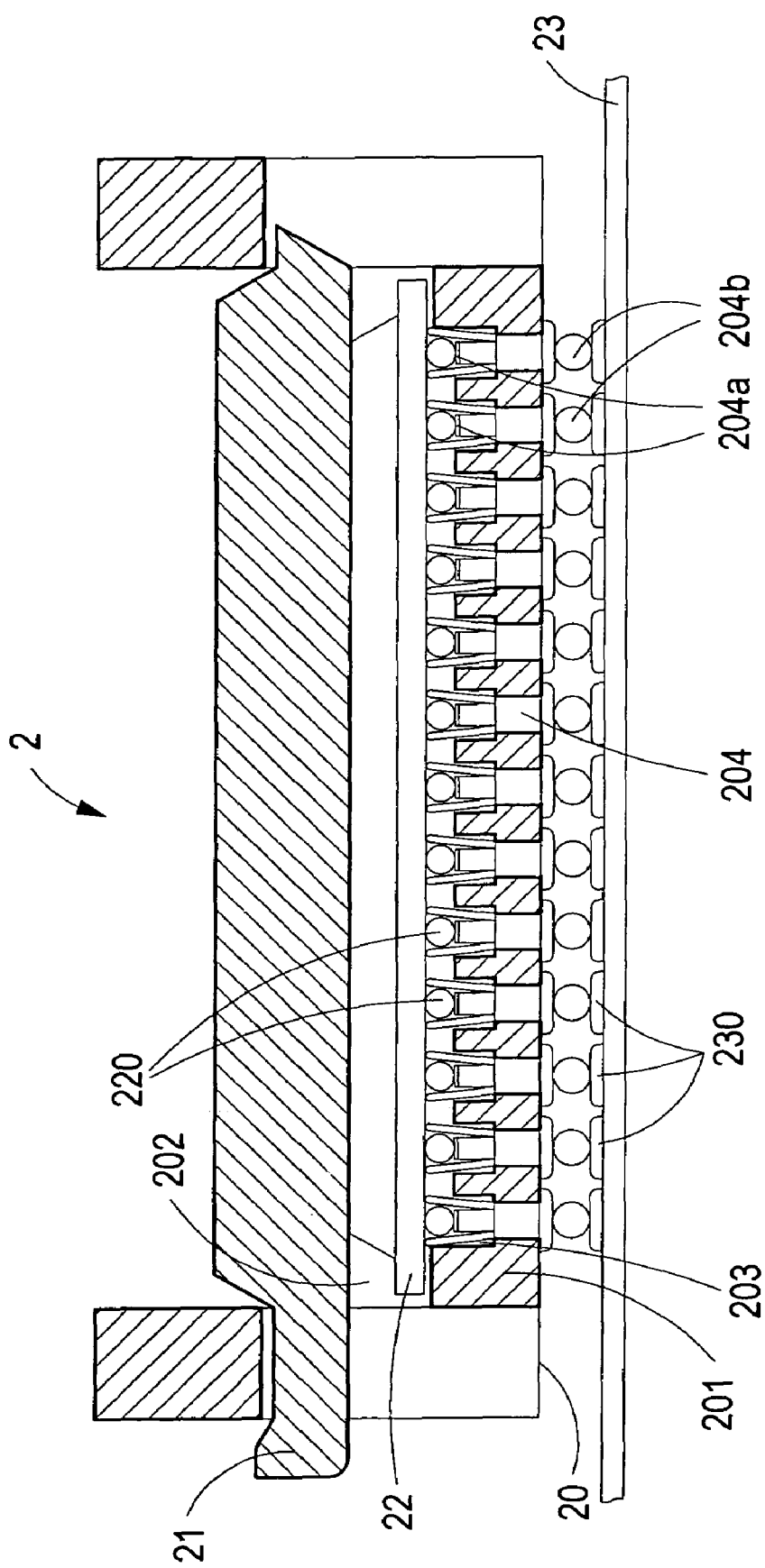
FIG. 2 is a cross-sectional view of another conventional BGA test socket assembly.
Figure 3:
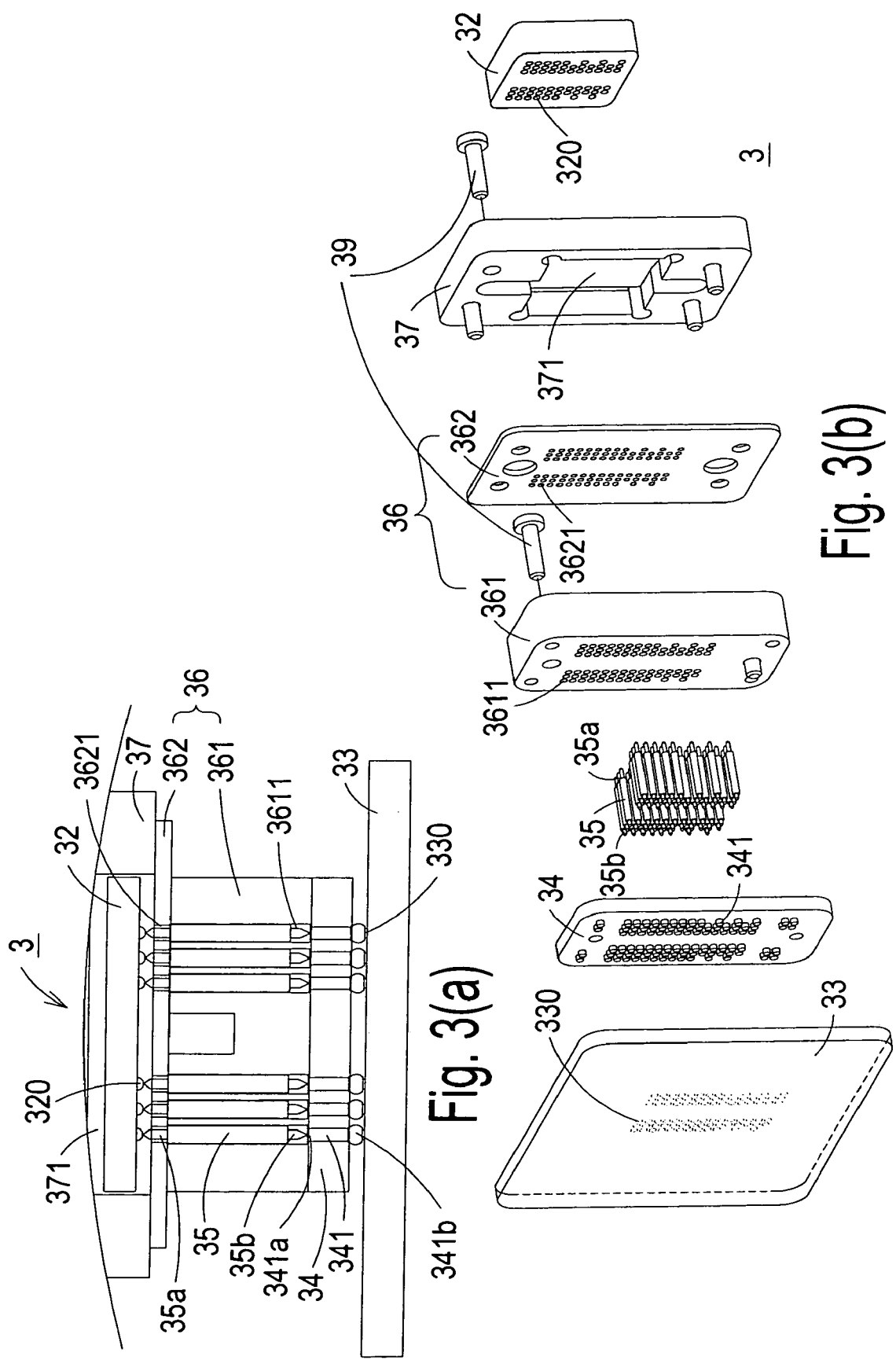
FIG. 3(a) is a cross-sectional view of a BGA test socket assembly according to a preferred embodiment of the present invention.
FIG. 3(b) is a schematic exploded view of a BGA test socket assembly of FIG. 3(a)

Please refer to FIGS. 3(a) and 3(b), which are respectively cross-sectional view and schematic exploded view of a BGA test socket assembly for interconnecting the ball contacts of the BGA package and the contact pads of the printed circuit board according to a preferred embodiment of the present invention. The BGA test socket assembly 3 of FIGS. 3(a) and 3(b) can be applied to the printed circuit board 33 of a real system in order to test the performance properties of the ball grid array package 32. Plural ball contacts 320 are formed on a surface of the ball grid array package 32, and at least corresponding number of conducting members 341 penetrate through the connecting interface 34 between upper and lower surfaces thereof. Each conducting member 341 is conductively connected to corresponding ball contact 320 via a resilient contact member 35. Via the conducting members 341 and the resilient contact members 35, the ball contacts 320 are conductively connected to the contact pads 330 on the printed circuit board 33 of a real system so as to test the performance properties of the ball grid array package 32.

Figure 4:
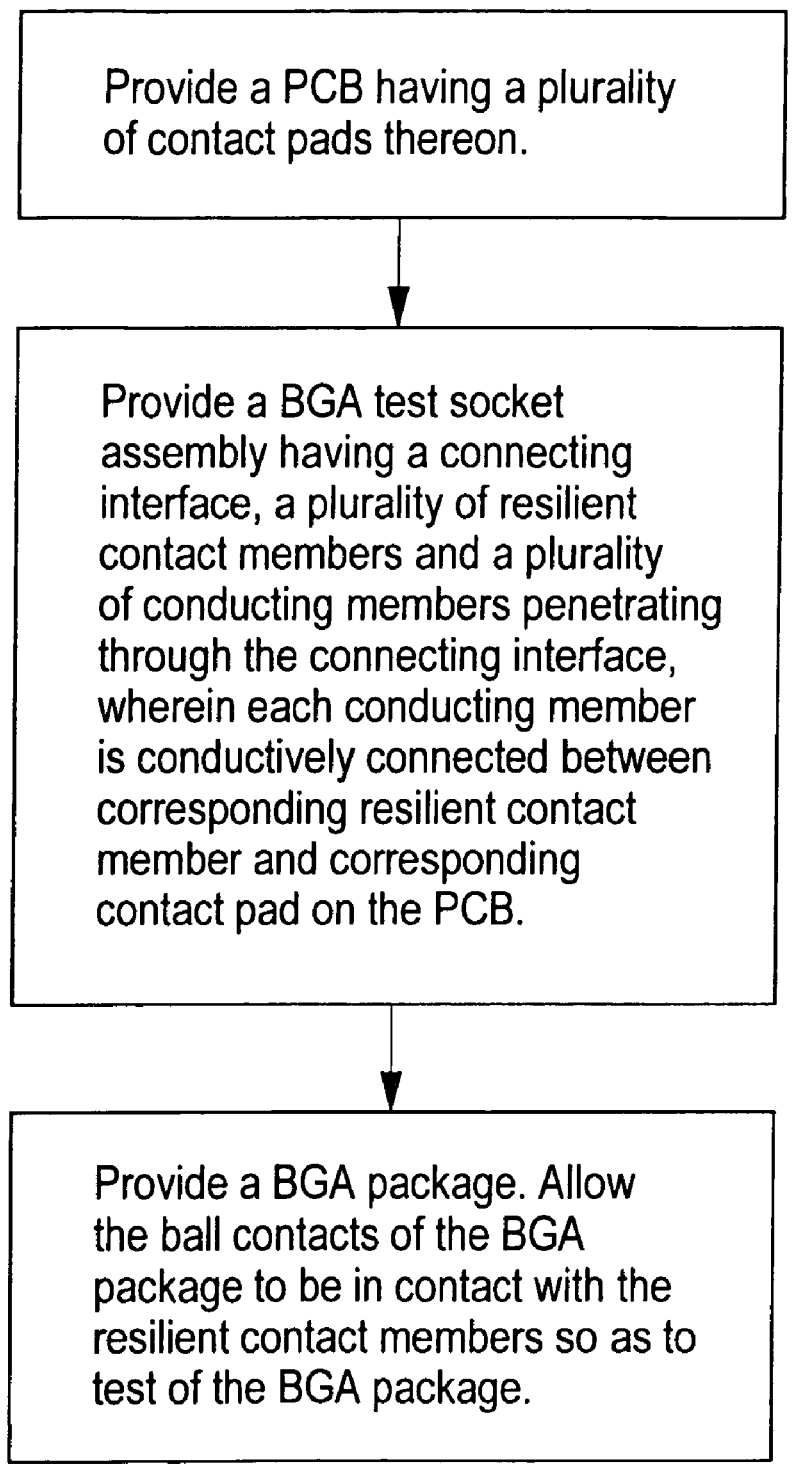
FIG. 4 is a flowchart illustrating a process of using the BGA test socket assembly to test the performance properties of ball grid array packages.

The process of using the BGA test socket assembly 3 to test the performance properties of the ball grid array package 32 will be illustrated with reference to the flowchart of FIG. 4 as well as the cross-sectional view of FIG. 3(a). Firstly, a printed circuit board 33 having plural contact pads 330 thereon and applicable to a real system is provided. Then, a BGA test socket assembly 3 with a connecting interface 34, plural resilient contact members 35 and plural conducting members 341 penetrating through the connecting interface 34 is provided. A first terminal 341a of each conducting member 341 is in contact with the second terminal 35b of corresponding resilient contact member 35. The second terminal 341b of each conducting member 341 is in contact with corresponding contact pad 330 on the printed circuit board 33. Afterwards, a ball grid array package 32 is provided, and the ball contacts 320 thereof are in contact with corresponding first terminals 35a of the resilient contact members 35. Under this circumstance, the performance properties of the ball grid array package 32 would be tested.

Please refer to FIGS. 3(a) and 3(b) again. The BGA test socket assembly 3 mainly comprises a connecting interface 34, plural resilient contact members 35, a fixing member 36 and a retaining base 37. In practice, after the ball grid array package 32 to be tested are accommodated within the receptacle 371 of corresponding retaining bases 37, a cover plate (not shown in FIGS. 3(a) and 3(b)) is placed on the resulting structure to shelter the ball grid array package 32.

The connecting interface 34 is arranged between the resilient contact members 35 and the printed circuit board 33 to serve as a transmission medium therebetween. The individual conducting member 341 penetrates through corresponding hole (not shown) in the connecting interface 34 such that the first terminal 341a and the second terminal 341b of the conducting member 341 are slightly protruded from top and bottom surfaces of the connecting interface 34, respectively. The conducting member 341 is preferably made of a metallic material such as tin or copper. The first terminal 341a of each conducting member 341 is in contact with the second terminal 35b of corresponding resilient contact member 35. The second terminal 341b of each conducting member 341 is a ball pin to be bonded to corresponding contact pad 330 on the printed circuit board 33 via a surface mount technology (SMT).

In some embodiments, the resilient contact members 35 are resilient pins and fixed on the fixing member 36. The fixing member 36 comprises a first fixing part 361 and a second fixing part 362, which have a plurality of first openings 3611 and second opening 3621, respectively. The first terminals 35a of the resilient contact members 35 are received in the second openings 3621 of the second fixing part 362. The second terminals 35b of the resilient contact members 35 are received in the first openings 3611 of the first fixing part 361. The first opening 3611 has a larger diameter than that of the second opening 3621 so as to receive the body portion of the resilient contact member 35.

The connecting interface 34, the fixing member 36 and the retaining base 37 are fastened together by fastening elements 39 such as screws. The retaining base 37 has another receptacle 371 for accommodating the ball grid array package 32 to be tested. As previously described, different moulds should be fabricated to produce the proper test socket assemblies in order to test the semiconductor packages conforming to different specifications. According to the present invention, since the retaining base 37 is detachable, if another ball grid array package with different size and pin number is to be tested, various retaining bases 37 with different sizes of receptacles 371 may be employed according to the designer's requirement.

Figure 5:
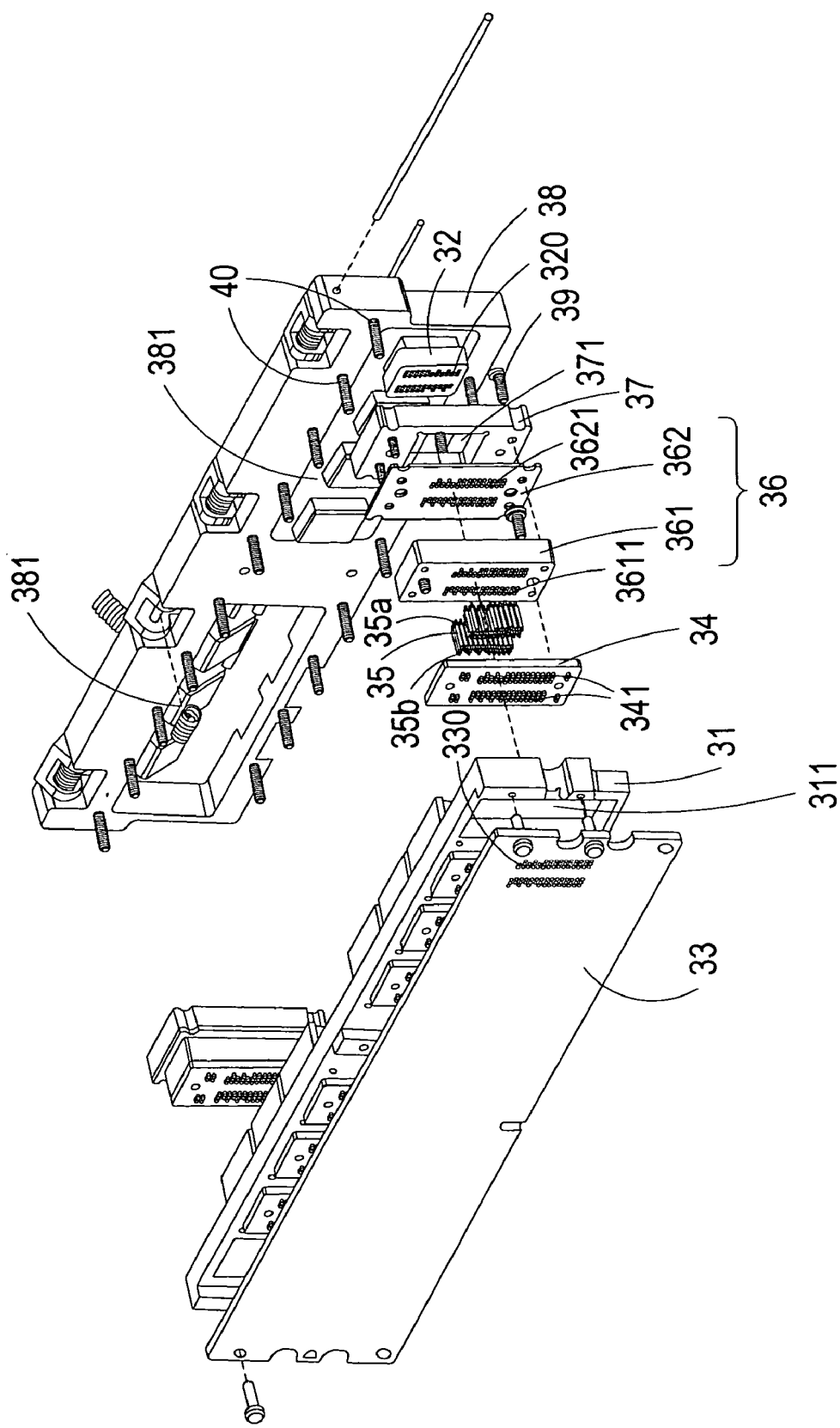
FIG. 5 is a schematic exploded view of a multi-chip test module according to another preferred embodiment of the present invention.
Figure 6:
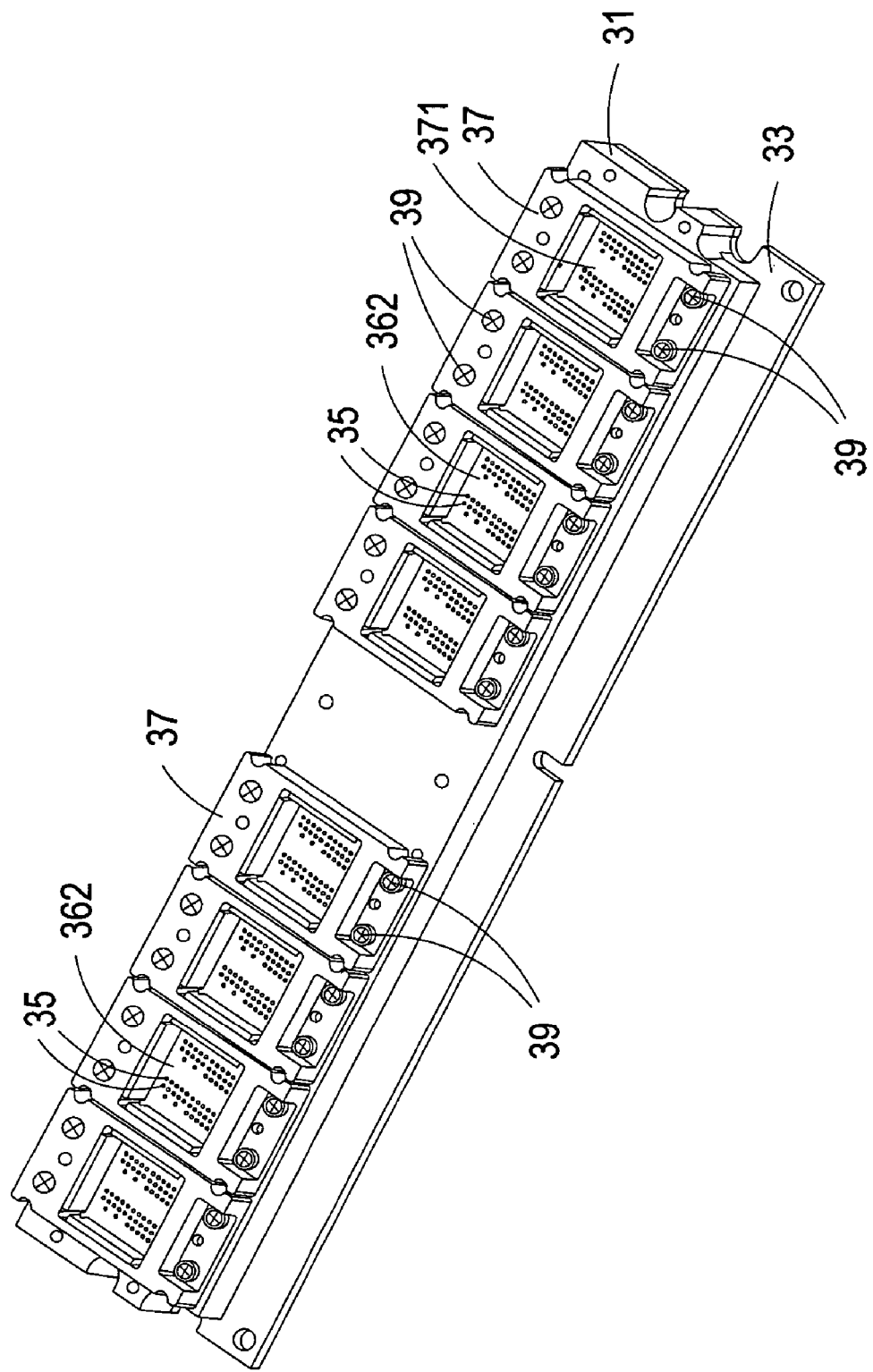
FIG. 6 is a schematic assembled view of a multi-chip test module in FIG. 5, wherein the cover plate and the ball grid array packages are not shown.
Figure 7:
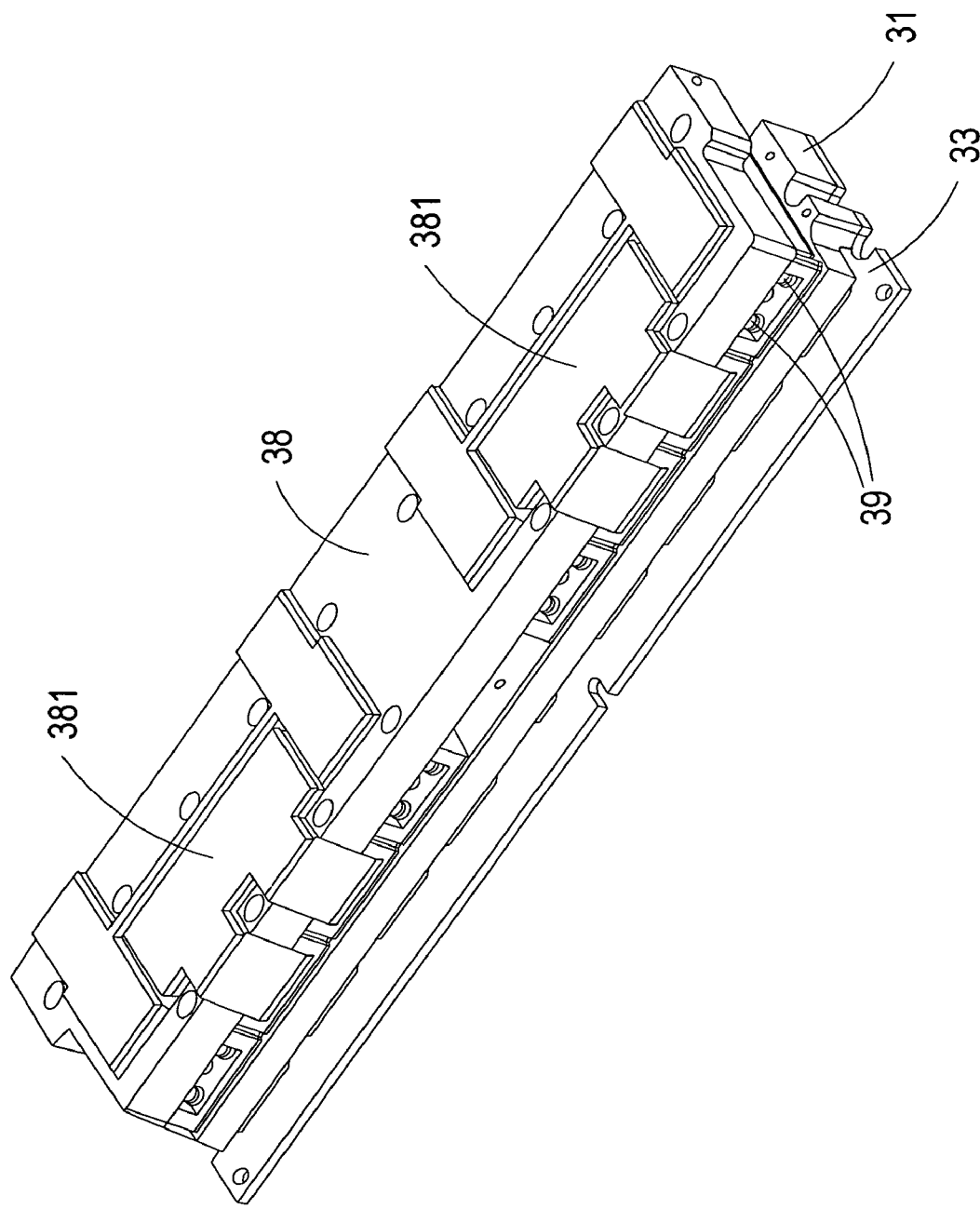
FIG. 7 is a schematic assembled view of a multi-chip test module in FIG. 5.

The testing method of the present invention can be applied to a single-chip test module with a single BGA test socket assembly 3 or a multi-chip test module having plural BGA test socket assemblies 3. Please refer to FIGS. 5, 6 and 7, which are schematic exploded and assembled views of a multi-chip test module according to another preferred embodiment of the present invention. The multi-chip test module can be used to test for example eight ball grid array packages 32. The multi-chip test module is mounted on the printed circuit board 33 of a real system, and comprises eight BGA test socket assemblies 3, each of which is similar to the BGA test socket assembly 3 as shown in FIGS. 3(a) and 3(b). For neat drawing only one BGA test socket assembly 3 is shown. Each BGA test socket assembly 3 comprises a supporting member 31, a connecting interface 34, plural resilient contact members 35, a fixing member 36 and a retaining base 37. In practice, after the ball grid array package 32 to be tested are accommodated within the receptacle 371 of corresponding retaining bases 37, a cover plate 38 is placed on the resulting structure to shelter the ball grid array package 32.

The connecting interface 34 is arranged between the resilient contact members 35 and the printed circuit board 33 to serve as a transmission medium therebetween. The individual conducting member 341 penetrates through corresponding hole (not shown) in the connecting interface 34 such that the first terminal 341a and the second terminal 341b of the conducting member 341 are slightly protruded from top and bottom surfaces of the connecting interface 34, respectively (as shown in FIG. 3(a)). The conducting member 341 is preferably made of a metallic material such as tin or copper. The first terminal 341a of each conducting member 341 is in contact with the second terminal 35b of corresponding resilient contact member 35. The second terminal 341b of each conducting member 341 is a ball pin to be bonded to corresponding contact pad 330 on the printed circuit board 33 via a surface mount technology (SMT).

In some embodiments, the resilient contact members 35 are resilient pins and fixed in the fixing member 36. The fixing member 36 comprises a first fixing part 361 and a second fixing part 362, which have a plurality of first openings 3611 and second opening 3621, respectively. The first terminals 35a of the resilient contact members 35 are received in the second openings 3621 of the second fixing part 362. The second terminals 35b of the resilient contact members 35 are received in the first openings 3611 of the first fixing part 361. The first opening 3611 has a larger diameter than that of the second opening 3621 so as to receive the body portion of the resilient contact member 35.

The connecting interface 34, the conducting members 341, the resilient contact members 35 and the first fixing part 361 are accommodated and fixed within a receptacle 311 of the supporting member 31. The retaining base 37 and the second fixing part 362 are arranged on the first fixing part 361 and secured onto the supporting member 31 via fastening elements 39 such as screws. The retaining base 37 has another receptacle 371 for accommodating the ball grid array package 32 to be tested. As previously described, different moulds should be fabricated to produce the proper test socket assemblies in order to test the semiconductor packages conforming to different specifications. According to the present invention, since the retaining base 37 is detachable, if another ball grid array package with different size and pin number is to be tested, various retaining bases 37 with different sizes of receptacles 371 bay be employed according to the designer's requirement. Afterwards, the cover plate 38 is secured onto the supporting member 31 or the printed circuit board via fastening elements 40 such as screws.

Figure 8:
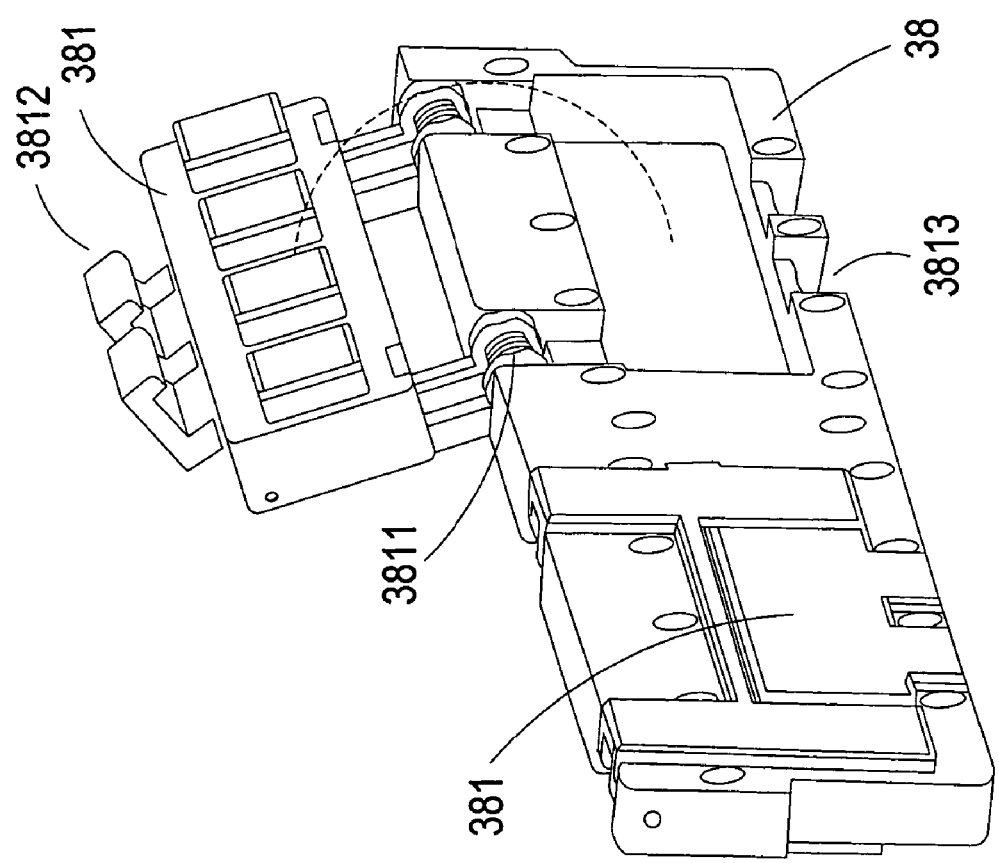
FIG. 8 is a schematic view illustrating operation of the foldable lid of the cover plate.

Referring to FIG. 8, the cover plate 38 has at least one foldable lid 381. One end 3811 of the foldable lid 38 is pivotally coupled to the cover plate 38. The other end of the foldable lid 381 has a hooking structure 3812. Once the hooking structure 3812 is hooked on a corresponding recess structure 3813 at one side of the cover plate 38, a depressing force is applied on the surface of the ball grid array package 32 such that the ball contacts 320 are in contact with the first terminals 35a of the resilient contact members 35. Under this circumstance, the ball grid array package 32 is conductively connected to the printed circuit board 33.

In a case that a multi-chip test module having plural BGA test socket assemblies 3 is used, the supporting member 31, the connecting interface 34, the fixing member 36, the retaining base 37 and the cover plate 38 are cooperatively shared for individual BGA test socket assembly 3.

It is understood from the above description that the multi-chip test module is capable of simultaneously testing plural ball grid array packages. In addition, the method and the socket assembly for testing a ball grid array package can be applied to the printed circuit boards of a real system. Furthermore, the retaining base is replaceable according to the size and shape of the ball grid array package to be tested. Therefore, the method and the socket assembly of the present invention are more cost-effective and user-friendly.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for testing a ball grid array package, comprising steps of:
   (a) providing a printed circuit board having a plurality of contact pads thereon;
   (b) providing a ball grid array test socket assembly having a supporting member, a connecting plate and a plurality of resilient contact members, wherein said supporting member has a receptacle for accommodating said connecting plate, said connecting plate has a plurality of conducting members penetrating through and directly fixed on said connecting plate, the first terminal of each conducting member is in contact with the second terminal of corresponding resilient contact member, and the second terminal of each conducting member is in contact with corresponding contact pad on said printed circuit board; and
   (c) allowing the ball contacts of said ball grid array package to be in contact with corresponding first terminals of said resilient contact members so as to test said ball grid array package.

2. The method according to claim 1 wherein the second terminal of each conducting member is a ball pin.

3. The method according to claim 2 wherein the second terminal of each conducting member is in contact with corresponding contact pad on said printed circuit board by a surface mount technology.

4. The method according to claim 1 wherein said conducting member is made of a metallic material selected from a group consisting of tin and copper.

5. The method according to claim 1 wherein said ball grid array test socket assembly further comprises a fixing member to fix said plurality of resilient contact members therein.

6. The method according to claim 5 wherein said fixing member comprises first and second fixing parts having a plurality of openings, and said resilient contact members penetrate through said openings.

7. The method according to claim 6 wherein said first fixing part and said connecting plate are accommodated in said receptacle of said supporting member.

8. The method according to claim 7 wherein said ball grid array test socket assembly further comprises a retaining base disposed on said second fixing part and having another receptacle for accommodating said ball grid array package therein, and said ball contacts of said ball grid array package are in contact with corresponding resilient contact members.

9. The method according to claim 8 wherein said ball grid array test socket assembly further comprises a cover plate with a foldable lid pivotally coupled thereto.

10. A socket assembly for testing a ball grid array package, the ball contacts of said ball grid array package being conductively connected to corresponding contact pads on a printed circuit board via said socket assembly, said socket assembly comprising:
    a connecting plate having a plurality of conducting members penetrating through and directly fixed on said connecting plate;
    a plurality of resilient contact members, each of which has a first terminal to be in contact with corresponding ball contact of said ball grid array package;
    wherein the first terminal of each conducting member is in contact with the second terminal of corresponding resilient contact member, and the second terminal of each conducting member is in contact with corresponding contact pad on said printed circuit board; and
    a supporting member having a receptacle for accommodating said connecting plate.

11. The socket assembly according to claim 10 wherein the second terminal of each conducting member is a ball pin.

12. The socket assembly according to claim 11 wherein the second terminal of each conducting member is contact with corresponding contact pad on said printed circuit board by a surface mount technology.

13. The socket assembly according to claim 10 wherein said conducting member is made of a metallic material selected from a group consisting of tin and copper.

14. The socket assembly according to claim 10 further comprising a fixing member to fix said plurality of resilient contact members therein.

15. The socket assembly according to claim 14 wherein said fixing member comprises first and second fixing parts having a plurality of openings, and said resilient contact members penetrate through said openings.

16. The socket assembly according to claim 15 wherein said first fixing part and said connecting plate are accommodated in said receptacle of said supporting member.

17. The socket assembly according to claim 16 further comprising a retaining base disposed on said second fixing part and having another receptacle for accommodating said ball grid array package therein, and said ball contacts of said ball grid array package are in contact with corresponding resilient contact members.

18. The socket assembly according to claim 17 further comprising a cover plate with a foldable lid pivotally coupled thereto.

* * * * *